(12) United States Patent
Komuro

(10) Patent No.: US 6,825,521 B2
(45) Date of Patent: Nov. 30, 2004

(54) SEMICONDUCTOR DEVICE WITH CAPACITOR

(75) Inventor: Genichi Komuro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/424,712

(22) Filed: Apr. 29, 2003

(65) Prior Publication Data
US 2004/0041193 A1 Mar. 4, 2004

(30) Foreign Application Priority Data

Aug. 30, 2002 (JP) ........................................ 2002-256143

(51) Int. Cl.$^7$ .......................................... H01L 27/108
(52) U.S. Cl. ........................ 257/311; 257/296; 257/304
(58) Field of Search ................................ 257/295–296, 257/304, 311

(56) References Cited

U.S. PATENT DOCUMENTS 5,270,238 A * 12/1993 Kim ............................ 438/253
5,350,705 A * 9/1994 Brassington et al. ....... 257/295
5,365,095 A * 11/1994 Shono et al. ................ 257/295
5,629,540 A * 5/1997 Roh et al. .................... 257/306
6,713,798 B2 * 3/2004 Okita .......................... 257/295

FOREIGN PATENT DOCUMENTS

JP 5-129156 5/1993

* cited by examiner

Primary Examiner—Allan R. Wilson
(74) Attorney, Agent, or Firm—Westerman, Hattori, Daniels & Adrian LLP

(57) ABSTRACT

There a provided a first insulating layer formed over a semiconductor substrate, a cell plate line formed on the first insulating layer and having a slit that divides a region except a contact area into both sides, a capacitor dielectric layer formed on the cell plate on both sides of the slit and having a clearance over the slit, and a plurality of capacitor upper electrodes formed on the capacitor dielectric layer in one column on both sides of the slit.

8 Claims, 17 Drawing Sheets

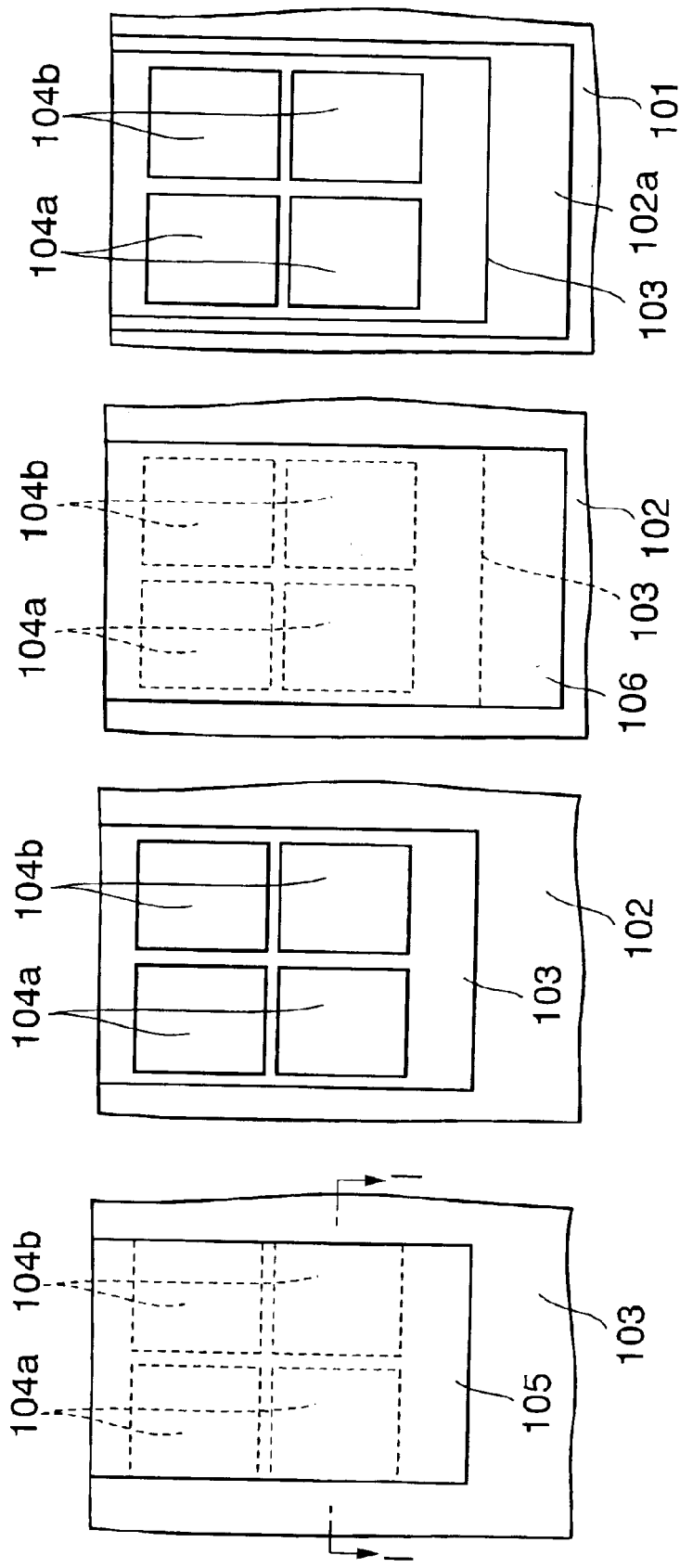

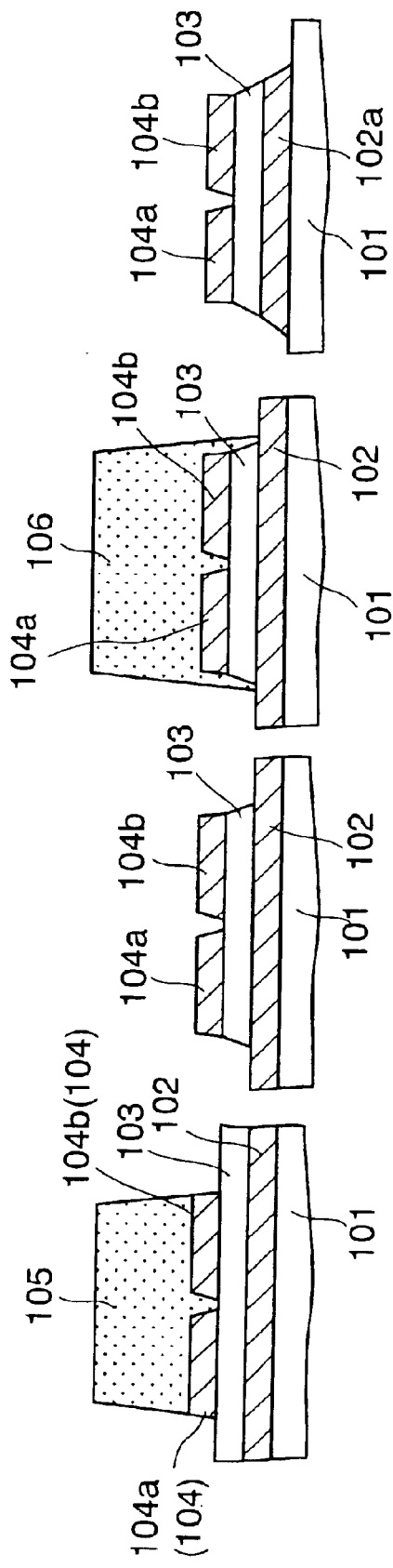

SEMICONDUCTOR DEVICE WITH CAPACITOR

CROSS-REFERENCE TO RELATED APPLICATIONS

This application is based upon and claims priority of Japanese Patent Application No.2002-256143, filed on Aug. 30, 2002, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

As one of the nonvolatile memories that can store information after the power supply is turned OFF, FeRAM (Ferroelectric Random Access Memory) having the ferroelectric substance is known. The FeRAM has such a structure that stores the information by utilizing the hysteresis characteristic of the ferroelectric substance, and can execute a high speed operation at a low power consumption. Thus, its future development is expected much more as the nonvolatile memory that can be rewritten so many times.

In the memory cell of the FeRAM, for example, there are 1T1C type that employs one transistor and one capacitor to store 1-bit information, and 2T2C type that employs two transistors and two capacitors to store 1-bit information. A cell area of the 1T1C type memory cell can reduce a cell area by half in comparison with the 2T2C type memory cell.

The capacitor of the memory cell of the FeRAM has such a structure that a plurality of upper electrodes are formed at an interval over a stripe-like lower electrode, which is called a cell plate, and the ferroelectric layer is put between the upper electrode and the lower electrode, for example. The cell plate serves as a common lower electrode of a plurality of capacitors. In this case, one upper electrode, the underlying ferroelectric layer, and the cell plate constitute one capacitor.

As the connection of the capacitors, it is set forth in Patent Application Publication (KOKAI) Hei 5-129156 that the capacitors are formed in series or in parallel by forming the upper electrodes or the lower electrodes of two capacitors commonly. More particularly, it is set forth in Patent Application Publication (KOKAI) Hei 5-129156 that two PZT ferroelectric films are formed on one lower electrode and then the upper electrodes are connected on these PZT ferroelectric films.

Meanwhile, if four upper electrodes or more are formed on one cell plate, they are formed in one column in the prior art. But they may be formed in two columns.

As the method of forming a plurality of upper electrodes on one cell plate in two columns, following steps are considered.

FIGS. 1A to 1D are plan views showing steps of forming the upper electrodes on one cell plate in two columns. FIGS. 2A to 2D are sectional views showing steps of forming the upper electrodes on one cell plate in two columns, and are sectional views taken along a I—I line in FIG. 1A.

First, as shown in FIG. 1A and FIG. 2A, a first conductive film 102, a ferroelectric film 103, and a second conductive film 104 are sequentially formed on an interlayer insulating film 101. Then, four upper electrodes 104a, 104b or more are formed in two columns along the cell plate forming region by patterning the second conductive film 104 while using a first resist pattern (not shown). Then, the resist is coated on the upper electrodes 104a, 104b and the ferroelectric film 103, and then exposed/developed. Thus, a second resist pattern 105 is formed in the cell plate forming region except the cell plate contact area. In this case, side surfaces of two-column upper electrodes 104a, 104b, which are positioned on both sides of the cell plate forming region, are formed to coincide substantially with both side surfaces of the second resist pattern 105.

Then, as shown in FIG. 1B and FIG. 2B, the ferroelectric film 103 is etched by using the second resist pattern 105 as a mask. Then, the second resist pattern 105 is removed.

Then, as shown in FIG. 1C and FIG. 2C, a resist is coated on the upper electrodes 104a, 104b, the ferroelectric film 103, and the first conductive film 102. Then, a third resist pattern 106 that covers selectively the overall cell plate forming region is formed by exposing/developing the resist.

Then, as shown in FIG. 1D and FIG. 2D, a cell plate (lower electrode) 102a is formed by etching the first conductive film 102 while using the third resist pattern 106 as a mask. Then, the third resist pattern 106 is removed.

According to the above capacitor forming steps, if the second resist pattern 105 shown in FIG. 1A and FIG. 2A is displaced from a desired position to either the right side or the left side, it is possible that, since one sides of the upper electrodes 104a, 104b aligned in two columns are etched when the ferroelectric film 103 is to be etched, an area of the left upper electrode 104a differs from an area of the right upper electrode 104b. Similarly, if the third resist pattern 106 shown in FIG. 1C and FIG. 2C is displaced to any one of the left side and the right side, it is possible that the area of the left upper electrode 104a is different from the area of the right upper electrode 104b.

The variation in the areas of the upper electrodes 104a, 104b acts as a cause to make capacitances of a plurality of capacitors in the memory cell region uneven, which exerts an influence upon the device operating margin. In particular, in the 1T1C type FeRAM, because "1" and "0" are read by comparing the capacitor of the memory cell with the reference capacitor, such variation in individual capacitor characteristics presents a serious problem.

SUMMARY OF THE INVENTION

It is an object of the present invention to provide a semiconductor device capable of reducing variation in an area of a plurality of upper electrodes that are formed in plural columns over a cell plate line, and a method of manufacturing the same.

According to one aspect of the present invention, there is provided a semiconductor device comprising: a first insulating layer formed over a semiconductor substrate; a cell plate line formed on the first insulating layer and having a slit that divides a region except a contact area into both sides; a capacitor dielectric layer formed on the cell plate line on both sides of the slit and having a clearance over the slit; and a plurality of capacitor upper electrodes formed on the capacitor dielectric layer in one column on both sides of the slit.

According to another aspect of the present invention, there is provided a method of manufacturing a semiconductor device, comprising the steps of: forming a first insulating layer over a semiconductor substrate; forming sequentially a first conductive layer, a dielectric layer, and a second conductive layer on the first insulating layer; forming a plurality of capacitor upper electrodes, which are aligned at an interval in plural columns, by patterning the second conductive layer; forming a first mask that has clearances between the capacitor upper electrodes in plural columns and passes over the plurality of capacitor upper electrodes in the plural columns respectively; forming a capacitor dielectric layer having clearances between the plural columns by etching the dielectric layer in a region that is not covered with the first mask; removing the first mask; forming a second mask, which has slits between the capacitor upper electrodes in the plural columns and is united by a contact area, on the capacitor upper electrodes, the capacitor dielectric layer, and the first conductive layer; forming a capacitor lower electrode, which has a contact area that is connected electrically to an external wiring, under the contact area by etching the first conductive layer in a region that is not covered with the second mask; and removing the second mask.

According to the present invention, the cell plate line in which the region (capacitor forming region) except the contact area to which the wiring or the plug is connected is divided into plural columns by the slit is provided, then the capacitor dielectric layer is formed in the region of the cell plate line on both sides of the slit respectively, and then a plurality of capacitor upper electrodes are formed in one column on the capacitor dielectric layer on both sides of the slit of the cell plate line respectively. In this case, the clearance (slit) is formed in the capacitor dielectric layer on the slit of the cell plate line. In such capacitor forming steps, after the capacitor upper electrodes are formed, the capacitor dielectric layer is patterned and then the capacitor lower electrode is formed.

Such cell plate line is formed by patterning the conductive film while using a mask having the slits at the positions that correspond to the regions between plural columns of the capacitor upper electrodes. Similarly, the clearances (slits) in the capacitor dielectric layer are formed by patterning the dielectric film while using a mask having the clearances (slits) at the positions that correspond to the regions between plural columns of the capacitor upper electrodes.

Therefore, even if such mask is displaced toward one of the left and right directions from the predetermined position, all the upper electrodes are exposed from the periphery of the mask or the slit on the opposite side to such displacement to have the same area. As a result, even though portions of a plurality of upper electrodes, which are exposed from the mask, are etched, the areas of a plurality of upper electrodes can be made equal.

In this case, a width of the slit (clearance) provided to the mask is decided to the value that does not cause a difference in the area in a plurality of upper electrodes between mutual columns.

BRIEF DESCRIPTION OF THE DRAWINGS

FIGS. 1A to 1D are plan views showing steps of forming capacitors on a plate electrode in two columns;

FIGS. 2A to 2D are sectional views showing steps of forming capacitors on a plate electrode in two columns;

DESCRIPTION OF THE PREFERRED EMBODIMENT

An embodiment of the present invention will be explained with reference to the drawings hereinafter.

FIGS. 3A to 3H are plan views showing steps of forming a capacitor of a memory cell of a semiconductor device according to an embodiment of the present invention. FIGS. 4A to 4J are sectional views showing steps of forming the capacitor of the memory cell of the semiconductor device according to the embodiment of the present invention. FIGS. 5A to 5F are sectional views showing steps of forming a transistor and its peripheral structure of the memory cell of the semiconductor device according to the embodiment of the present invention.

Figure 3A:
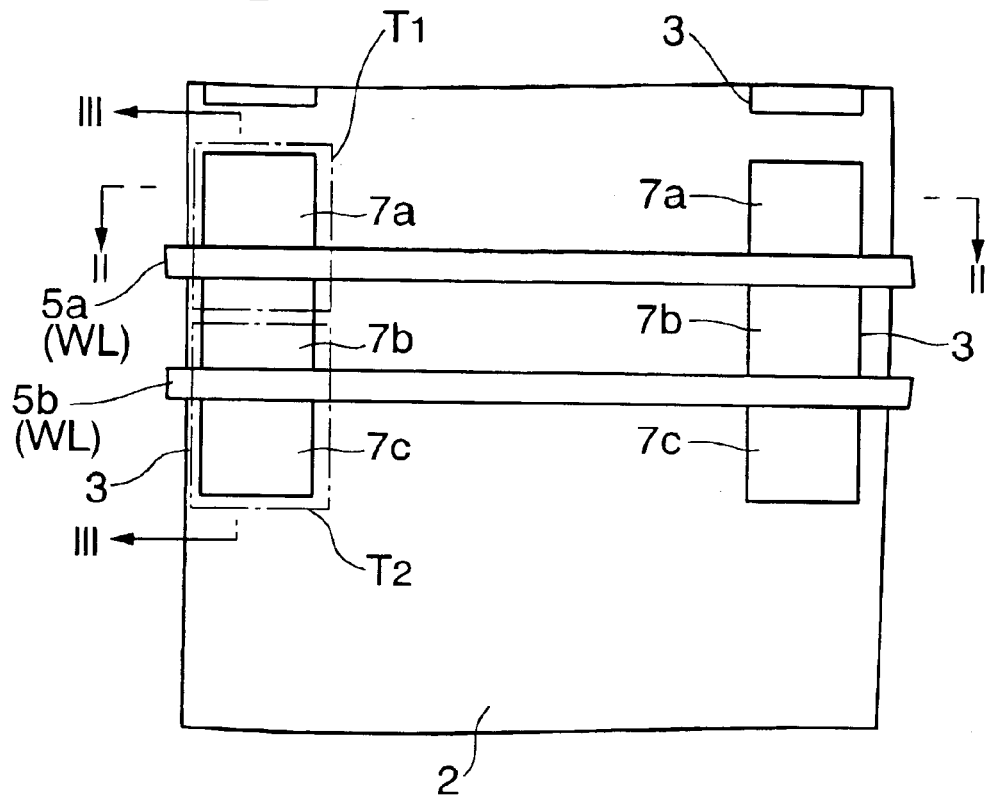
FIGS. 3A to 3H are plan views showing steps of forming a capacitor of a memory cell of a semiconductor device according to an embodiment of the present invention.

In this case, FIGS. 4A to 4J are sectional views taken along a II—II line in FIG. 3A, and FIGS. 5A to 5F are sectional views taken along a III—III line in FIG. 3A.

Figure 4A:
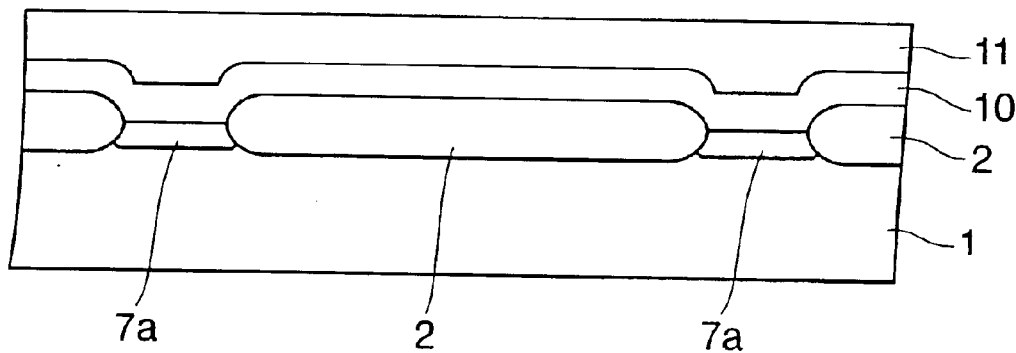
FIGS. 4A to 4J are sectional views showing steps of forming the capacitor of the memory cell of the semiconductor device according to the embodiment of the present invention.
Figure 5A:
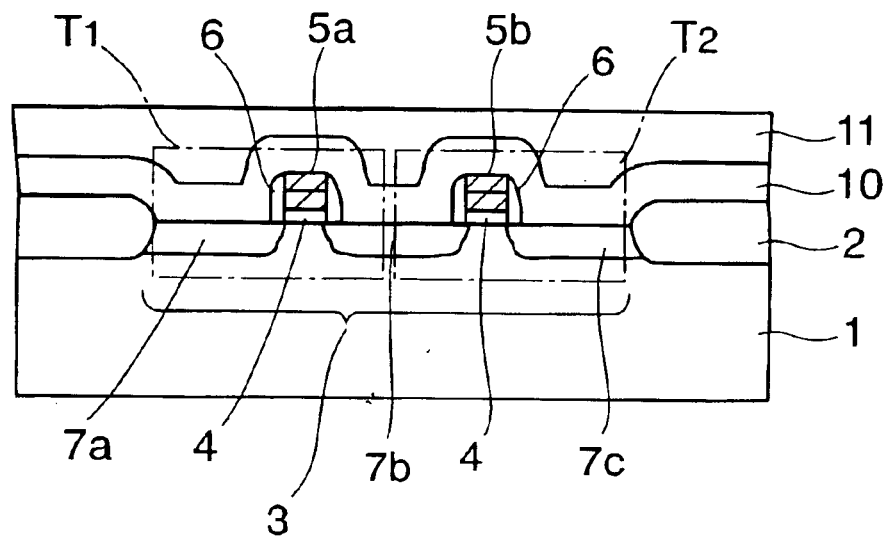
FIGS. 5A to 5F are sectional views showing steps of forming a transistor and its peripheral structure of the memory cell of the semiconductor device according to the embodiment of the present invention.

Next, steps required until a structure shown in FIG. 3A, FIG. 4A, and FIG. 5A is formed will be explained hereunder.

First, an element isolation insulating layer 2 is formed on a surface of a p-type silicon (semiconductor) substrate 1 by the LOCOS (Local Oxidation of Silicon) method. In this case, as the element isolation insulating layer 2, the STI (Shallow Trench Isolation) structure may be employed in addition to the silicon oxide layer formed by the LOCOS method. The element isolation insulating layer 2 is formed in a range to surround a predetermined active region (transistor forming region) 3 in the memory cell region of the silicon substrate 1.

A planar shape of the active region 3 is an almost rectangle. A plurality of active regions 3 are formed at an interval along both sides of stripe-like cell plate line forming regions whose width is about 2.3 μm. A plurality of cell plate line forming regions are arranged in almost parallel at a distance.

Then, a silicon oxide layer that is used as a gate insulating layer 4 on the active region 3 is formed by thermally oxidizing the surface of the silicon substrate 1.

Then, a polysilicon or amorphous silicon layer and a tungsten silicide layer are formed sequentially on the element isolation insulating layer 2 and the gate insulating layer 4. Then, the silicon layer and the tungsten silicide layer are patterned into a predetermined shape by the photolithography method. Thus, gate electrodes 5a, 5b are formed on the active region 3. In the memory cell region, the two gate electrodes 5a, 5b are formed on the active region 3 in almost parallel at an interval. These gate electrodes 5a, 5b are extended onto the element isolation insulating layer 2 to serve as the word line WL. An extending direction of the word line WL is set in the direction that intersects with an extending direction of the cell plate line forming region, for example.

Then, first to third n-type impurity diffusion regions 7a, 7b, 7c serving as sources/drains of the n-channel MOS transistors $T_1$, $T_2$ are formed by ion-implanting the n-type impurity into the active region 3 on both sides of the gate electrodes 5a, 5b. The second n-type impurity diffusion region 7b positioned in the center of the active region 3 is connected electrically to the bit line described later. Also, the first and third n-type impurity diffusion regions 7a, 7c positioned on both end sides of the active region 3 are connected electrically to the capacitors described later.

Then, an insulating layer is formed on the silicon substrate 1, the element isolation insulating layer 2, and the gate electrodes 5a, 5b. Then, sidewall insulating layers 6 are left on both side portions of the gate electrodes 5a, 5b by etching back the insulating layer. As the insulating layer, silicon oxide ($SiO_2$) formed by the CVD method, for example, is used. In this case, in FIGS. 3A to 3H, the sidewall insulating layers 6 are omitted from the illustration.

Then, the n-type impurity is ion-implanted into the n-type impurity diffusion regions 7a to 7c by using the gate electrodes 5a, 5b and the sidewall insulating layers 6 on the active region 3 as a mask. Thus, the n-type impurity diffusion regions 7a to 7c have the LDD structure.

Accordingly, formation of a first n-MOS transistor $T_1$ having the first and second n-type impurity diffusion regions 7a, 7b and the gate electrode 5a and formation of a second n-MOS transistor $T_2$ having the second and third n-type impurity diffusion regions 7b, 7c and the gate electrode 5b are completed.

Then, as shown in FIG. 4A and FIG. 5A, a cover insulating layer 10 for covering the n-MOS transistors $T_1$, $T_2$ is formed on the silicon substrate 1 by the plasma CVD method. As the cover insulating layer 10, a silicon oxide nitride (SiON) layer, for example, is formed.

Then, a silicon oxide ($SiO_2$) layer of about 1.0 $\mu$m thickness is grown on the cover insulating layer 10 by the plasma CVD method using the TEOS gas. Thus, this silicon oxide layer is used as a first interlayer insulating layer 11.

Then, as the densifying process of the first interlayer insulating layer 11, the first interlayer insulating layer 11 is annealed at the temperature of 700° C. for 30 minute in the nitrogen atmosphere at the atmospheric pressure. Then, an upper surface of the first interlayer insulating layer 11 is polished by the CMP (Chemical Mechanical Polishing) method to planarize.

In this case, in FIG. 3A, the insulating layers formed at the higher position than the element isolation insulating layer 2 are omitted from the illustration.

Figure 3B:
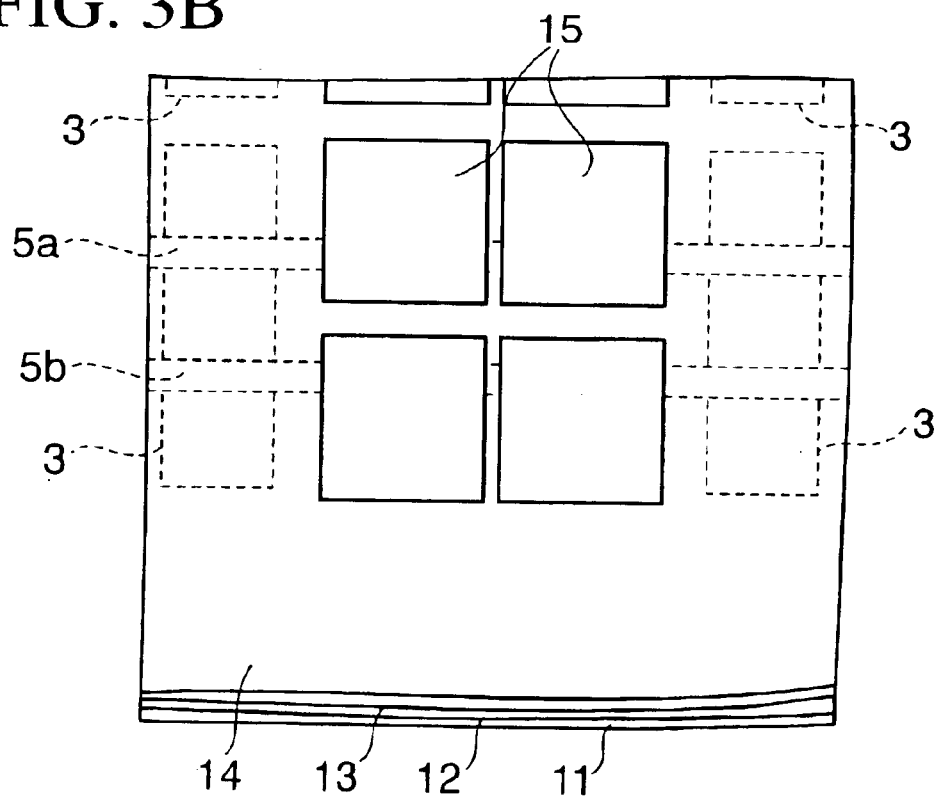
Figure 4B:
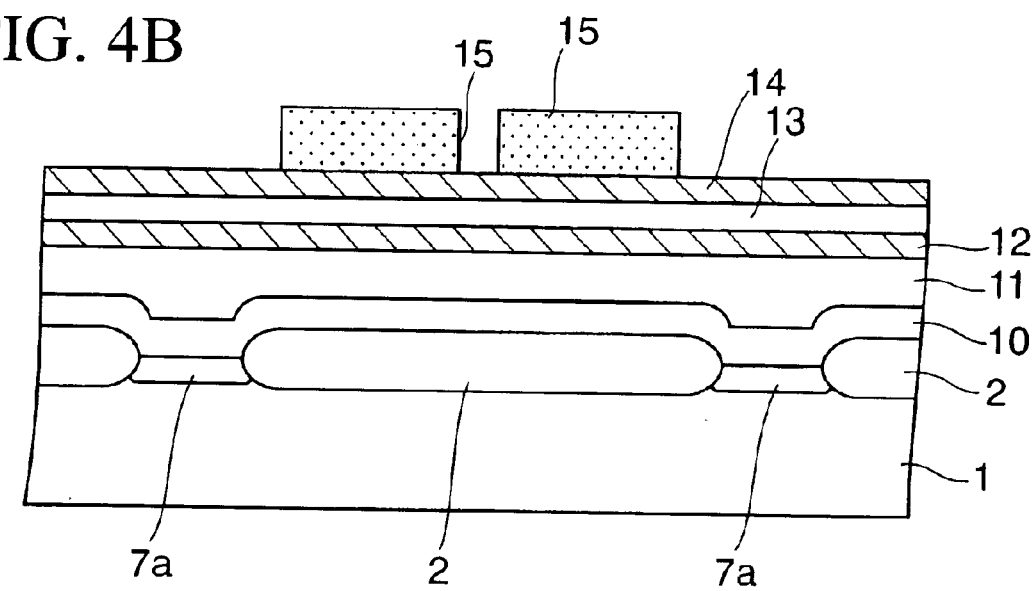
Figure 5B:
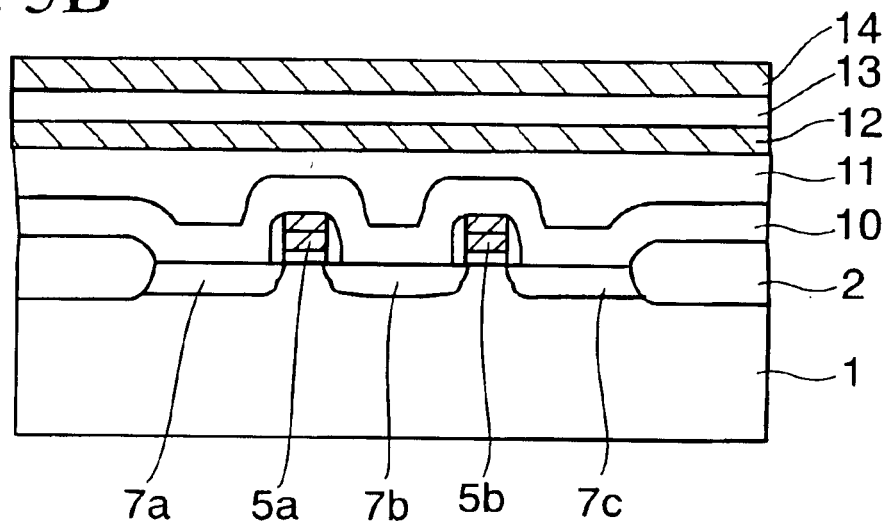

Next, steps required until a structure shown in FIG. 3B, FIG. 4B, and FIG. 5B is formed will be explained hereunder.

First, a Ti layer and a platinum (Pt) layer are formed sequentially as a first conductive layer 12 on the first interlayer insulating layer 11. The Ti layer and the Pt layer are formed by the DC sputter method. In this case, a thickness of the Ti layer is set to about 10 to 30 nm, and a thickness of the Pt layer is set to about 100 to 300 nm. In this case, as the first conductive layer 12, a conductive layer made of any one of iridium, ruthenium, ruthenium oxide, iridium oxide, strontium ruthenium oxide ($SrRuO_3$), etc. may be formed.

Then, a lead zirconate titanate (PZT; $Pb(Zr_{1-x}Ti_x)O_3$) layer of 100 to 300 nm thickness is formed as a ferroelectric layer 13 on the first conductive layer 12 by the RF sputter method. As the method of forming the ferroelectric layer 13, there are the MOD (Metal Organic Desposition) method, the MOCVD (Metal Organic CVD) method, the sol-gel method, etc. in addition to the above. Also, as the material of the ferroelectric layer 13, the other PZT-based material such as PLCSZT, PLZT, or the like, Bi-layered structure compound such as $SrBi_2Ta_2O_9$ (SBT, Y1), $SrBi_2(Ta, Nb)_2O_9$ (SBTN, YZ), or the like, and other metal oxide ferroelectric substance may be employed in addition to PZT.

Then, as the crystallizing process of the PZT layer constituting the ferroelectric layer 13, RTA (Rapid Thermal Annealing) is carried out at the temperature of 650 to 850° C. for 30 to 120 second in the oxygen atmosphere. For example, the annealing is carried out at the temperature of 700° C. for 60 second.

Then, an iridium oxide ($IrO_2$) layer of 100 to 300 nm thickness is formed as a second conductive layer 14 on the ferroelectric layer 13 by the sputter method. In this case, platinum or strontium ruthenium oxide (SRO) may be employed as the second conductive layer 14.

As described above, the first conductive layer 12 and the second conductive layer 14 are made of noble metal or noble metal oxide.

Next, the second conductive layer 14, the ferroelectric layer 13, and the first conductive layer 12 are patterned sequentially.

First, resist is coated on the second conductive layer 14. A plurality of first resist patterns 15 used to form the upper electrode are formed in the cell plate line forming region at an interval by exposing/developing the resist. The first resist pattern 15 has a planar shape having a width of 1.0 $\mu$m and a length of 1.7 $\mu$m, and is formed in plural, e.g., four or more, in two columns along the longitudinal direction of the cell plate line forming region. An interval between the first resist patterns 15 is set to 0.3 $\mu$m, for example.

A contact area to the wiring is contained in the cell plate line forming region, but the first resist patterns 15 is not formed on the contact area. That is, the region of the cell plate line forming region except the contact area serves as the capacitor forming region.

Then, the second conductive layer 14 in the region that is not covered with the first resist pattern 15 is etched. Thus, the second conductive layer 14 left under a plurality of first resist patterns 15 is used as capacitor upper electrodes 14a, 14b. The upper electrodes 14a, 14b are formed in the cell plate line forming region in two columns on the left and right sides.

As the etching conditions in this case, for example, the inductively coupled plasma etching equipment is employed, a chlorine ($Cl_2$) gas and an argon (Ar) gas are introduced into the etching atmosphere at 20 ml/min and 30 ml/min respectively, and a degree of vacuum in the etching atmosphere is set to 0.7 Pa. In addition, the temperature of the wafer stage on which the silicon substrate 1 is loaded is set to 25° C., a source power is set to 1400 W, and a bias power is set to 800 W. In this case, the source power is a power of a high-frequency power supply of 13.56 MHz, which is applied to the antenna coil of the inductively coupled plasma etching equipment. Also, the bias power is a power of a high-frequency power supply of 400 kHz, which is applied to the wafer stage.

Figure 3C:
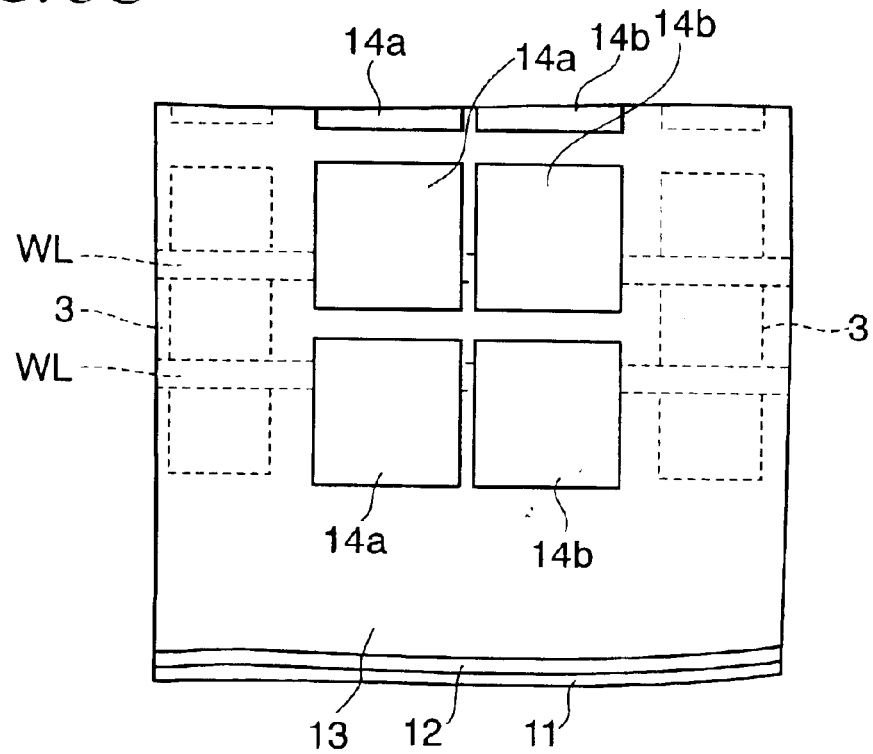
Figure 4C:
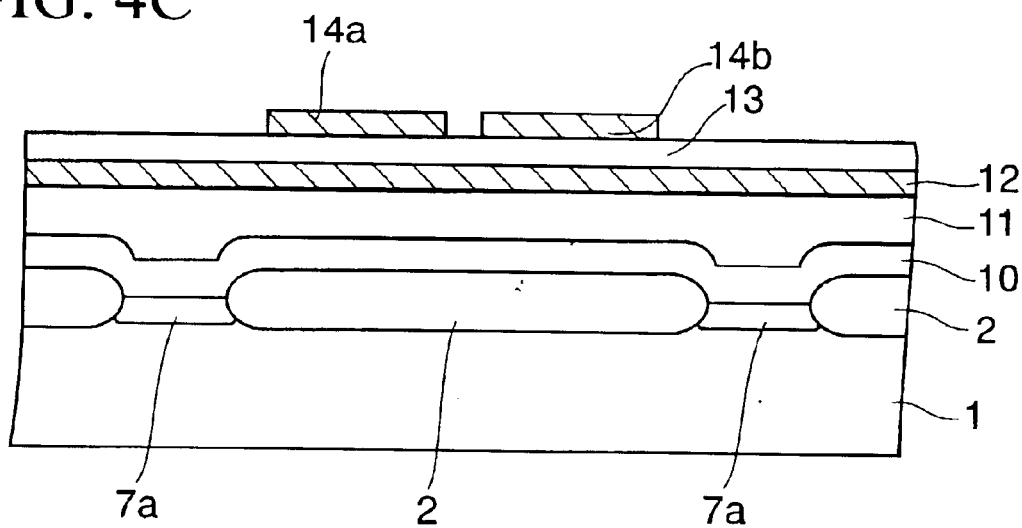

Then, as shown in FIG. 3C and FIG. 4C, the upper electrodes 14a, 14b appear when the first resist patterns 15 are removed.

Figure 3D:
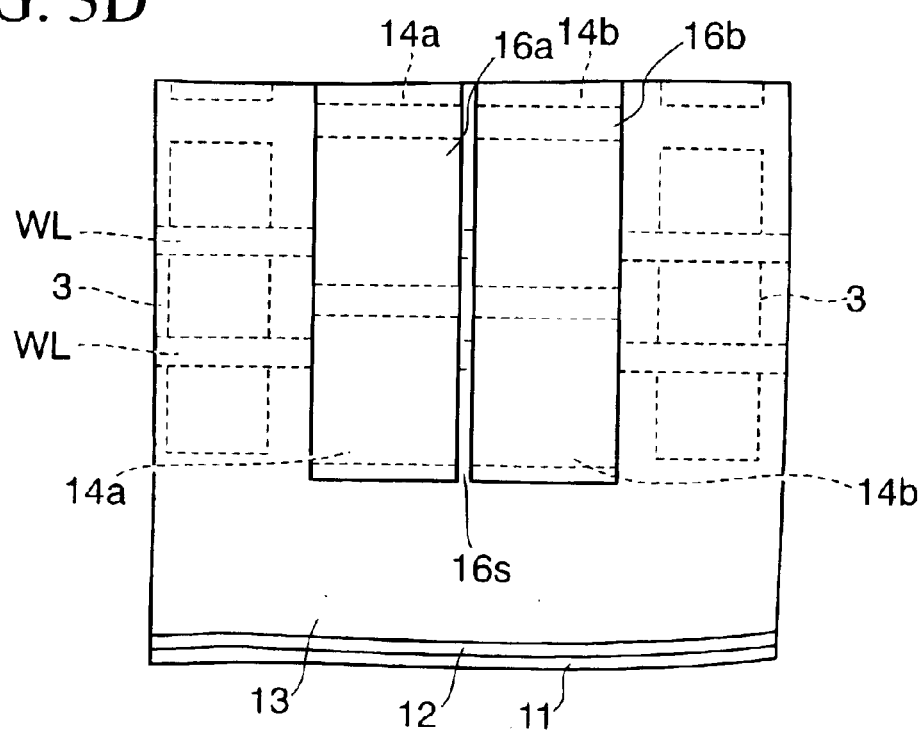
Figure 4D:
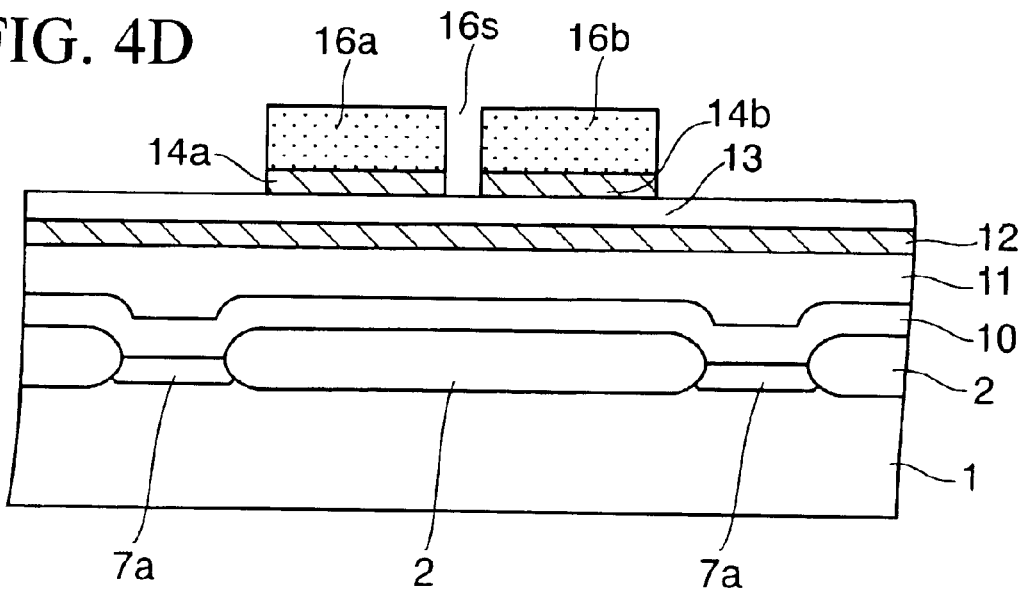

Then, as shown in FIG. 3D and FIG. 4D, resist is coated on the upper electrodes 14a, 14b and the ferroelectric layer 13, and then the resist is exposed/developed. Thus, in the cell plate line forming region, a second resist pattern 16a that passes over the upper electrodes 14a aligned in one column near one side (left side in Figures) and a third resist pattern 16b that passes over the upper electrodes 14b aligned in one column near the other side (right side in Figures) are formed. A clearance (or slit) 16s is present between the second resist pattern 16a and the third resist pattern 16b.

In this case, the second and third resist patterns 16a, 16b are the isolated pattern that is formed in the region of the cell plate line forming region except the contact area. But such resist patterns may have almost U-shaped planar shapes that are coupled with each other at a part of the contact area of the cell plate line forming region.

Then, the ferroelectric layer 13 is etched in the region that is not covered with the second and third resist patterns 16a, 16b. The etching conditions of the ferroelectric layer 13 are set to the same etching conditions as the second conductive layer 14, for example. In this case, the over-etching may be carried out after the etching of the ferroelectric layer 13 is completed.

Thus, patterns of the ferroelectric layer 13 left under the second and third resist patterns 16a, 16b are used as capacitor dielectric layers 13a, 13b. A clearance (slit) 13s is formed between the left and right dielectric layers 13a, 13b.

Figure 3E:
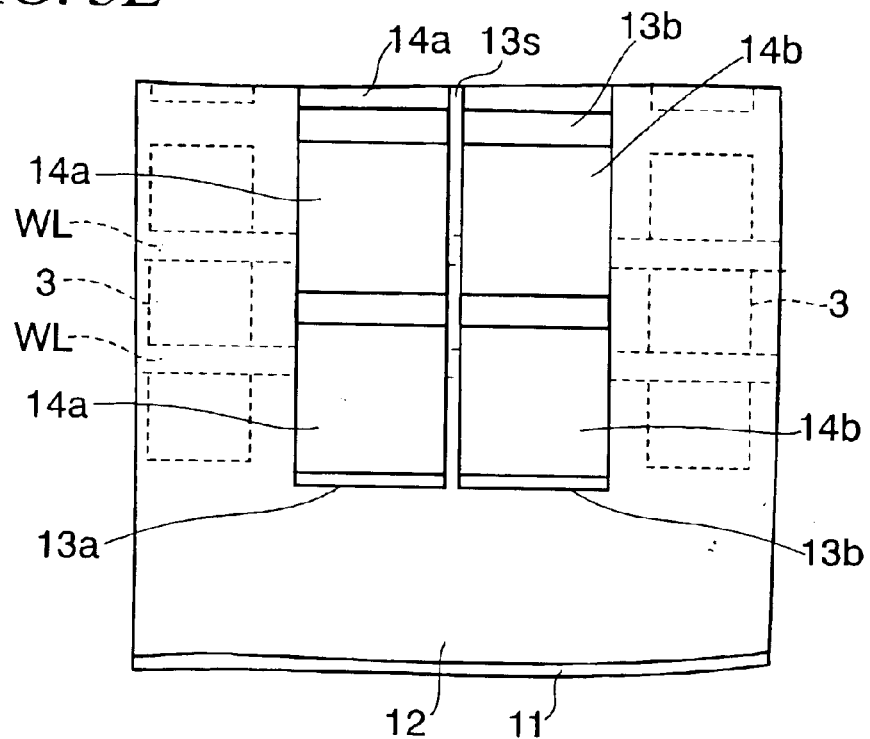
Figure 4E:
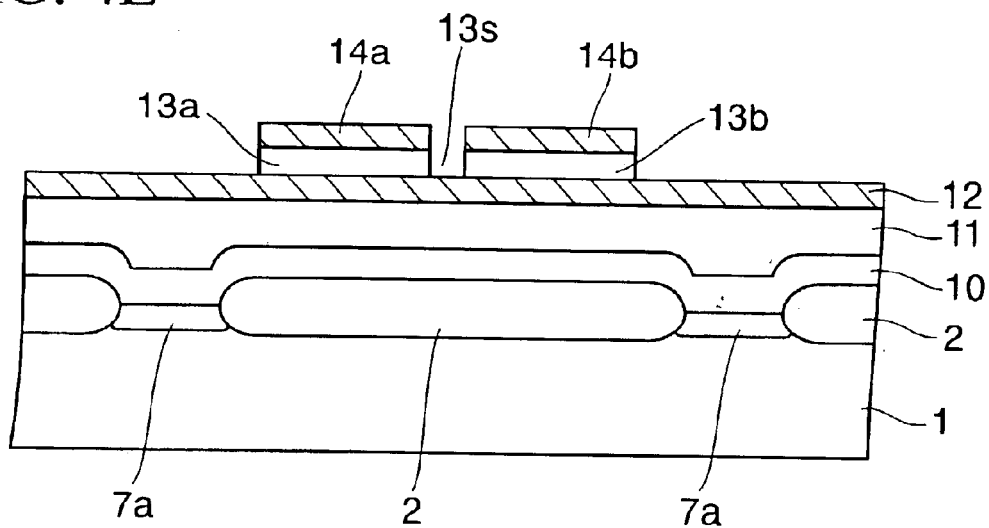

Then, as shown in FIG. 3E and FIG. 4E, the second and third resist patterns 16a, 16b are removed. In the cell plate line forming region, the left-side dielectric layer 13a that passes under a plurality of upper electrodes 14a in one left-side column and the right-side dielectric layer 13b that passes under a plurality of upper electrodes 14b in one right-side column are formed.

Figure 3F:
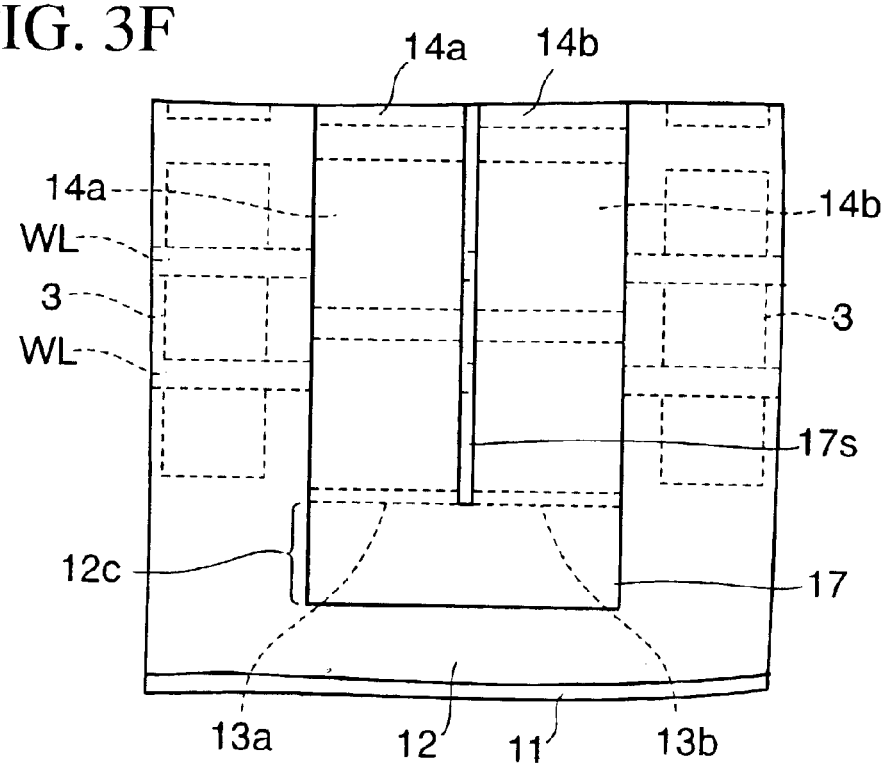
Figure 4F:
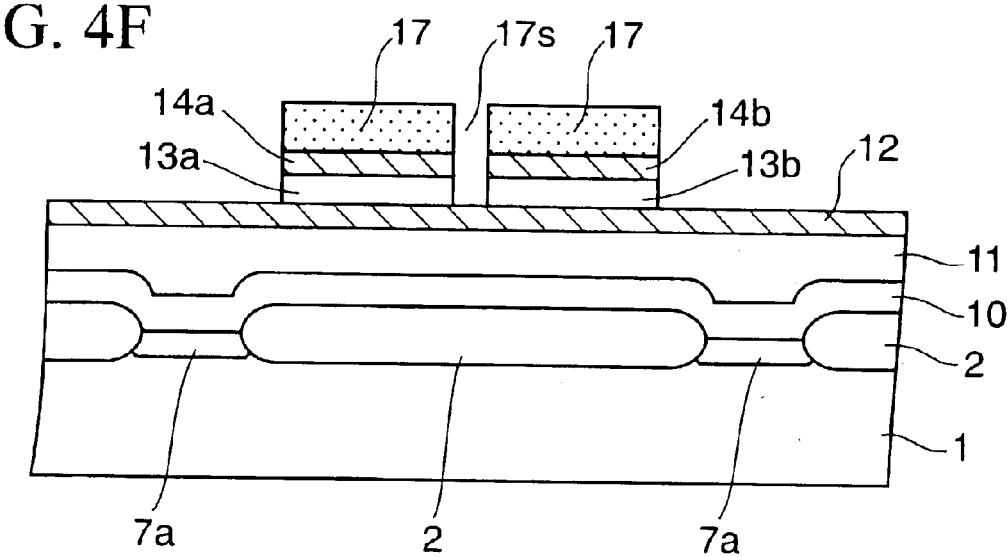

Then, as shown in FIG. 3F and FIG. 4F, resist is coated on the upper electrodes 14a, 14b, the dielectric layers 13a, 13b, and the first conductive layer 12. Fourth resist patterns 17 that have a shape for covering the cell plate line forming region are formed by exposing/developing the resist.

A slit 17s that separates the capacitor forming region, which is the cell plate line forming region other than the contact area, into left and right portions and has a width of about 0.3 μm is formed between the fourth resist patterns 17. The first conductive layer 12 is exposed from the slit 17s. The fourth resist patterns 17 are located to aim at positioning the slit 17s between a plurality of upper electrodes 14a aligned in one left column and a plurality of upper electrodes 14b aligned in one right column.

Then, the first conductive layer 12 in the region that is not covered with the fourth resist patterns 17 is etched. Thus, the first conductive layer 12 that are left under the fourth resist patterns 17 acts as a cell plate line 12a that functions as the capacitor lower electrode. The etching conditions in this case are set to the same etching conditions as the first conductive layer 12, for example. In addition, the over-etching is carried out to the same extent as the etching time of the first conductive layer 12.

Figure 3G:
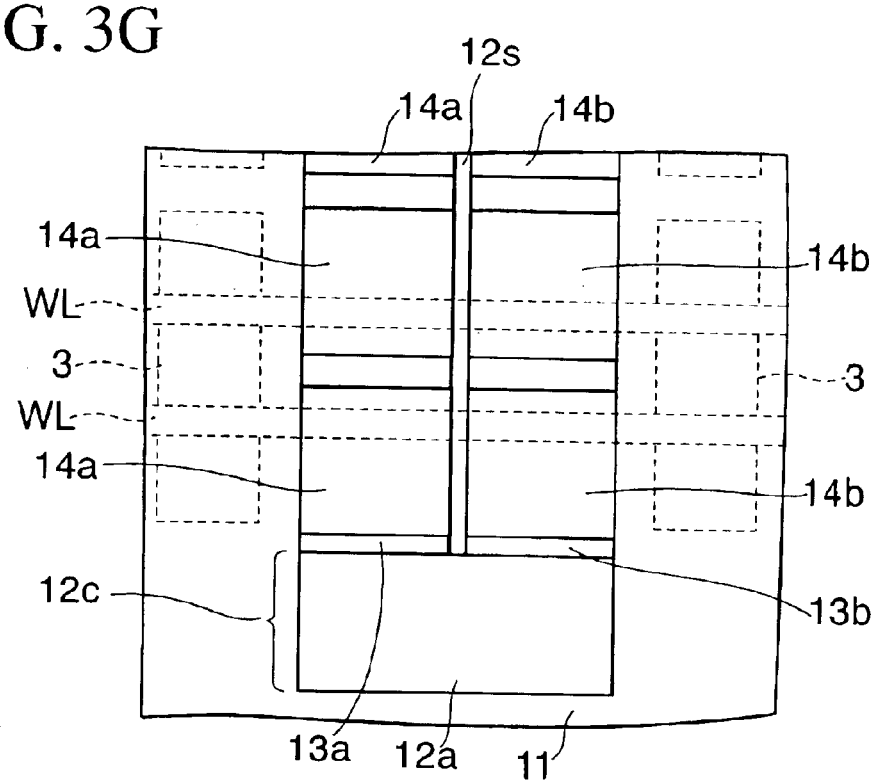
Figure 4G:
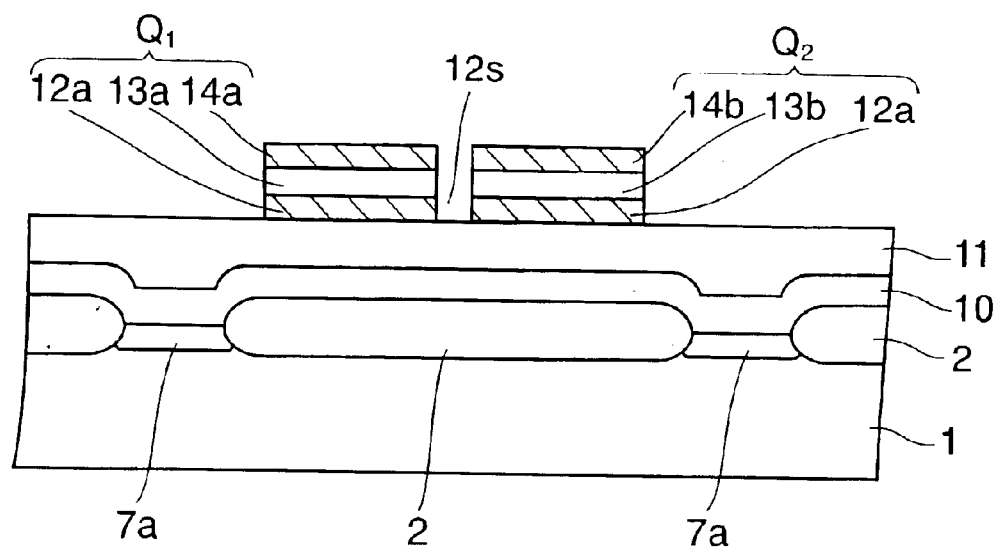

Then, as shown in FIG. 3G and FIG. 4G, the fourth resist patterns 17 are removed. The lower electrodes 12a appeared in this manner have respective shapes that pass under the upper electrodes 14a, 14b and the dielectric layers 13a, 13b and have a contact area 12c protruded from the dielectric layers 13a, 13b. In addition, a slit 12s is formed between the left dielectric layer 13a and the right dielectric layer 13b.

Thus, in the memory cell region, one capacitor $Q_1$ ($Q_2$) consists of one upper electrode 14a (14b), the dielectric layer 13a (13b), and the lower electrode 12a. In other words, the capacitors $Q_1$ ($Q_2$) are formed in the cell plate line forming region as many as the upper electrodes 14a, 14b.

Figure 5C:
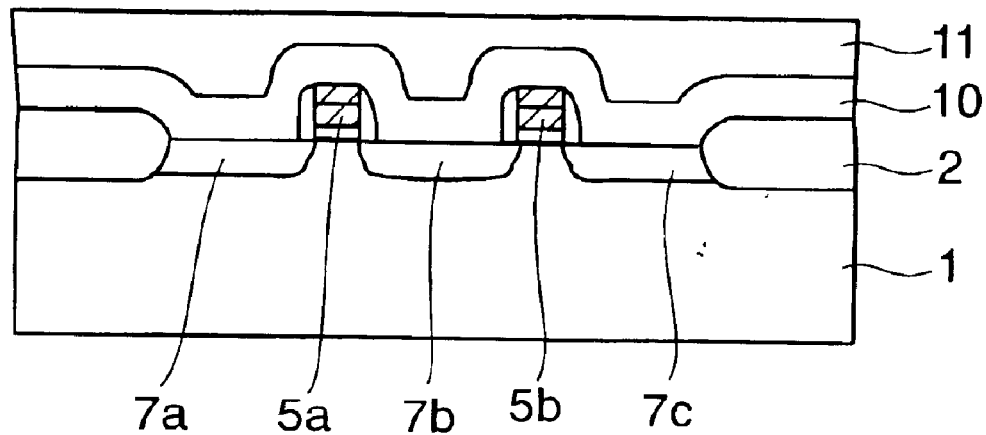

In the state that the capacitors $Q_1$ ($Q_2$) are formed by the above steps, as shown in FIG. 5C, the first conductive layer 12, the ferroelectric layer 13, and the second conductive layer 14 are removed over the transistors $T_1$, $T_2$.

In this case, an interval between the left-side upper electrode 14a and the right-side upper electrode 14b is set to have a size that is equal to or more than a displacement margins of the second to fourth resist patterns 16a, 16b, 17. Also, a size of the clearance 16s between the second resist pattern 16a and the third resist pattern 16b is almost identical to a size of the slit 17s between the fourth resist patterns 17, and has a value that is equal to or more than the displacement margins of the second to fourth resist patterns 16a, 16b, 17. In addition, desirably sizes of the clearance 16s and the slit 17s should be decided such that, even if the displacements are caused rightward and leftward in the opposite direction mutually, a part of the clearance 16s and a part of the slit 17s are overlapped with each other.

Figure 4H:
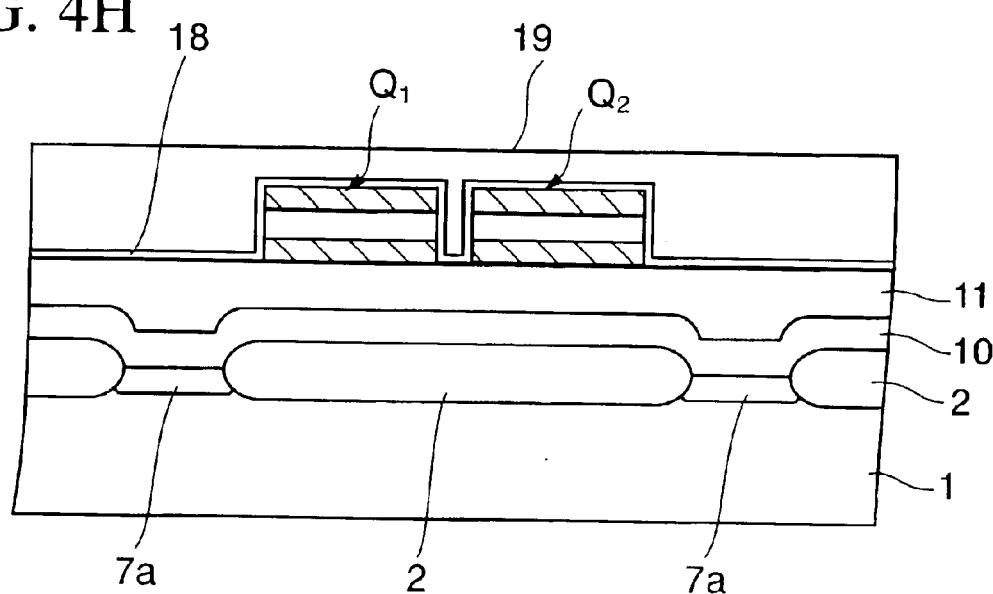
Figure 5D:
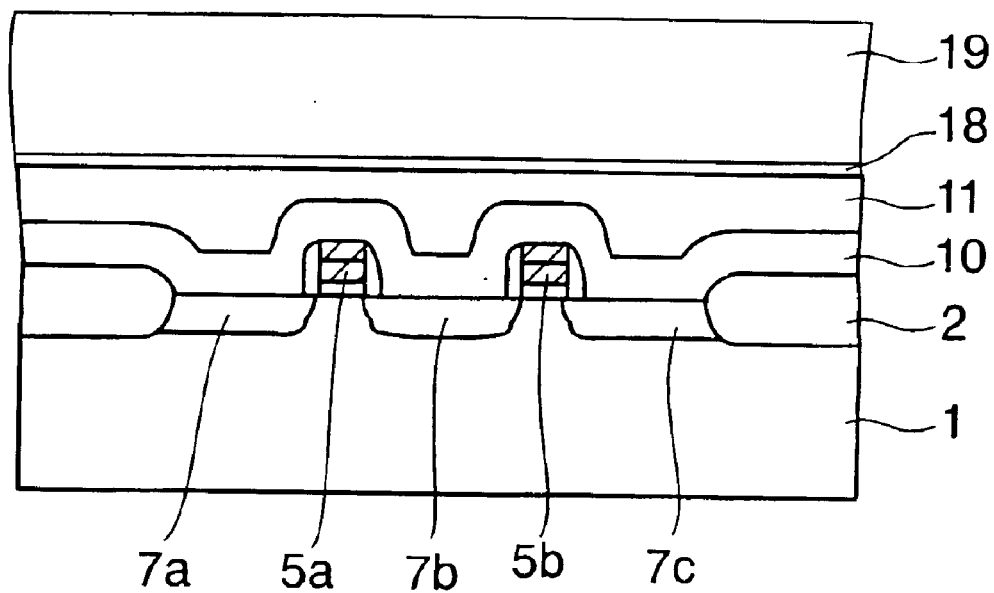

Then, as shown in FIG. 4H and FIG. 5D, alumina of about 20 nm thickness, for example, is formed as a capacitor-protection insulating layer 18 on the capacitors $Q_1$, $Q_2$ and the first interlayer insulating layer 11. In this case, as the capacitor-protection insulating layer 18, a PZT layer, a silicon nitride layer, a silicon oxide nitride layer, or the like may be applied.

Then, a silicon oxide layer of about 1 μm thickness is formed as a second interlayer insulating layer 19 on the capacitor-protection insulating layer 18. This silicon oxide layer is formed by the CVD method using a mixed gas consisting of TEOS, helium, and oxygen.

Then, an upper surface of the second interlayer insulating layer 19 is planarized by the CMP method. In this example, a remaining thickness of the second interlayer insulating layer 19 after CMP, if combined with a thickness of the capacitor-protection insulating layer 18, is about 300 nm on the capacitors $Q_1$, $Q_2$ in the memory cell region A.

Figure 4I:
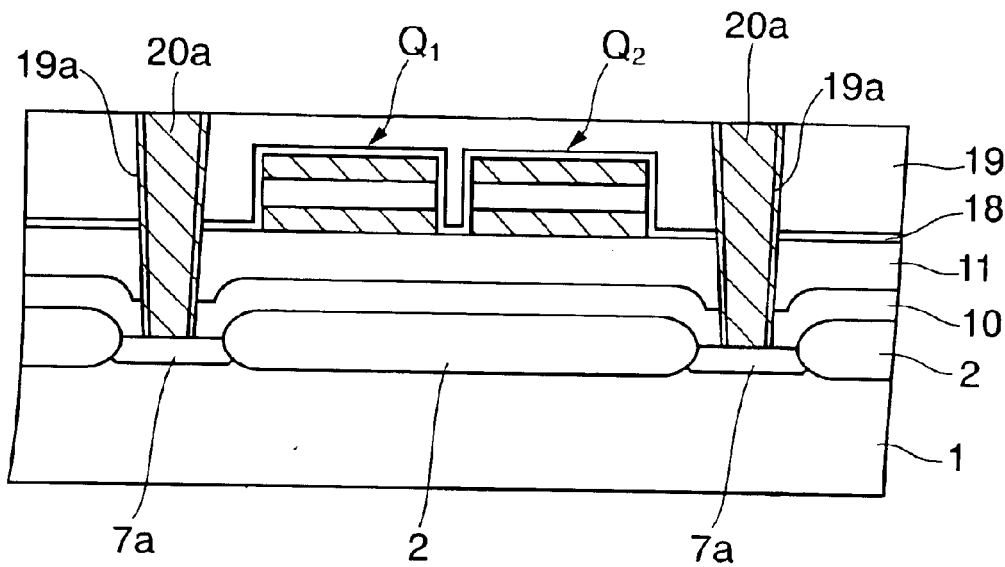
Figure 5E:
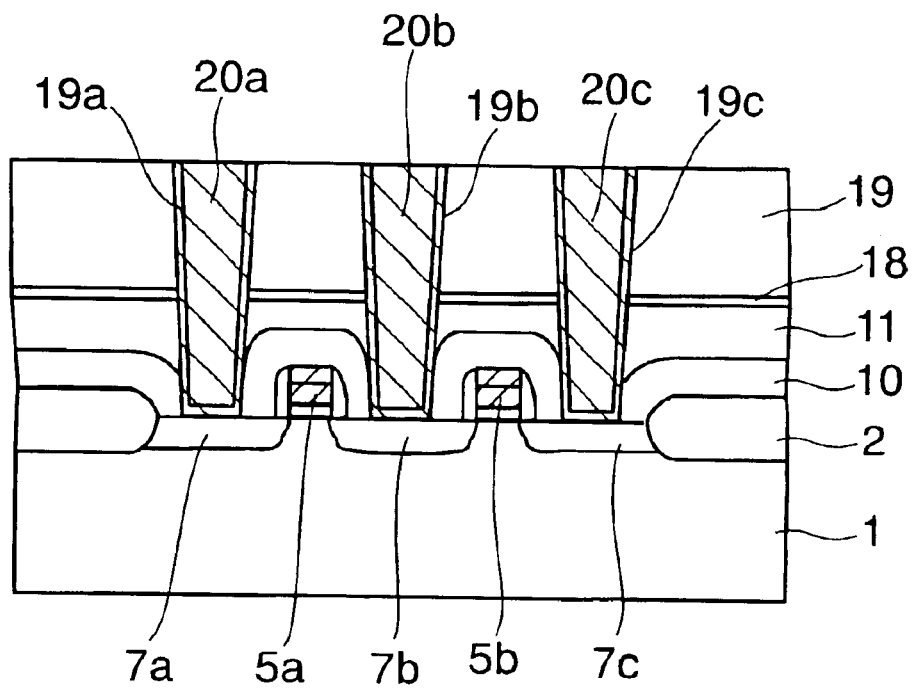

Next, steps required until a structure shown in FIG. 4I and FIG. 5E is formed will be explained hereunder.

First, the second interlayer insulating layer 19, the capacitor-protection insulating layer 18, the first interlayer insulating layer 11, and the cover insulating layer 10 are patterned by the photolithography method. Thus, capacitor contact holes 19a, 19c are formed on the first and third n-type impurity diffusion regions 7a, 7c respectively and simultaneously a bit-line contact hole 19b is formed on the second n-type impurity diffusion region 7b.

Then, a titanium (Ti) layer of 20 nm thickness and a titanium nitride (TiN) layer of 50 nm thickness are formed sequentially on the second interlayer insulating layer 19 and in the capacitor contact holes 19a, 19c and the bit-line contact hole 19b by the sputter. Then, a tungsten (W) layer is formed on the TiN layer by the CVD method. The W layer is formed to have a thickness that can bury perfectly insides of the capacitor contact holes 19a, 19c and the bit-line contact hole 19b.

Then, the Ti layer, the TiN layer, and the W layer are polished by the CMP method to remove from an upper surface of the second interlayer insulating layer 19. Thus, the Ti layer, the TiN layer, and the W layer left in the capacitor contact holes 19a, 19c are used as first and third conductive plugs 20a, 20c for the capacitor contact, and also the Ti layer, the TiN layer, and the W layer left in the bit-line contact hole 19b is used as a second conductive plug 20b for the bit-line contact.

Figure 3H:
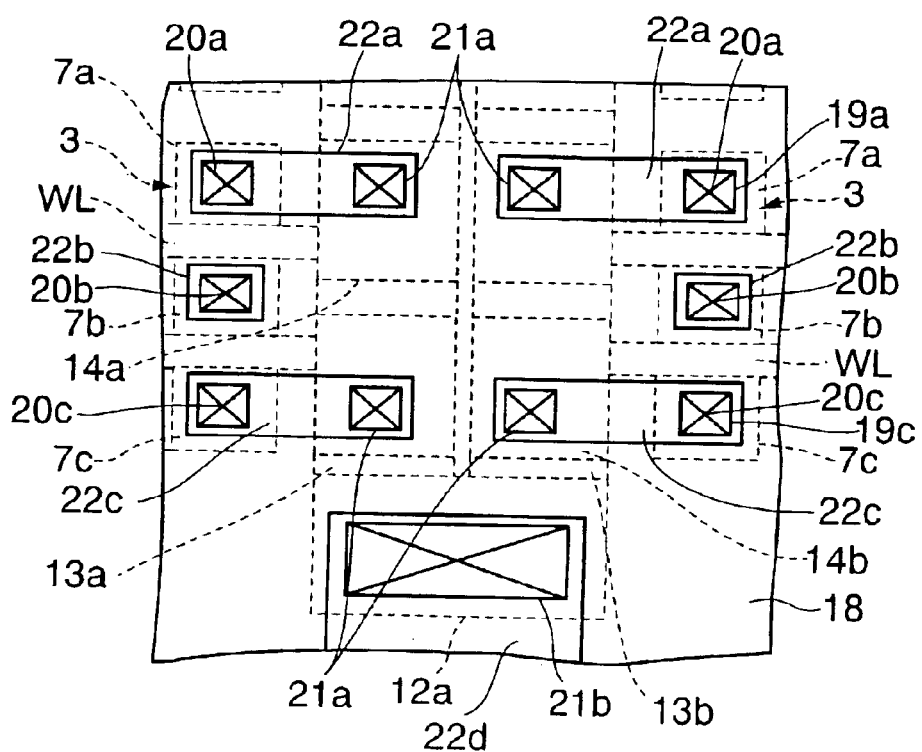
Figure 4J:
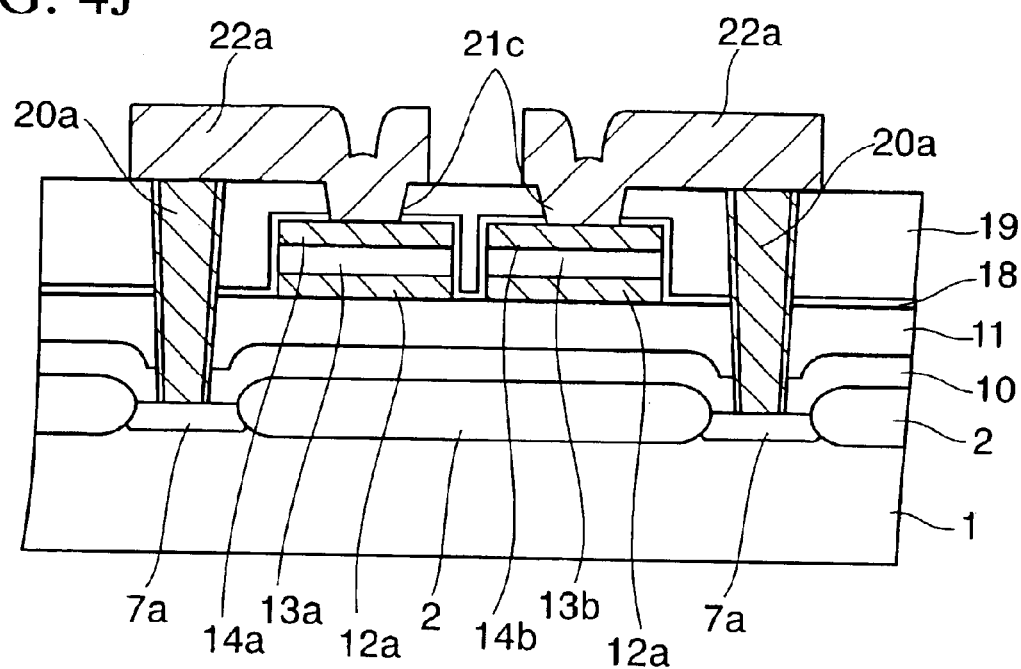
Figure 5F:
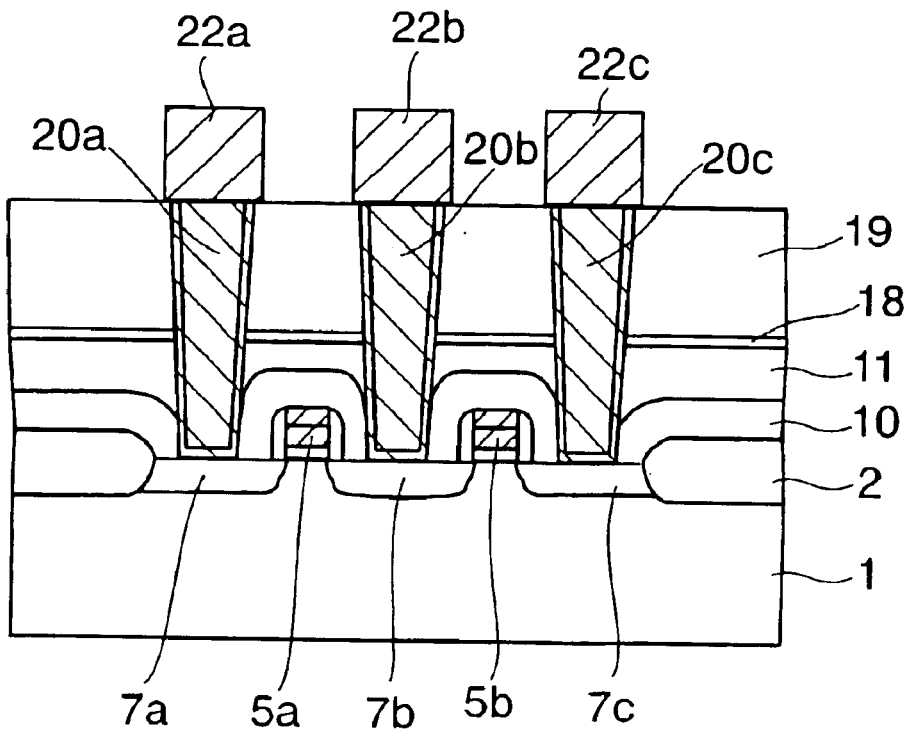

Next, steps required until a structure shown in FIG. 3H, FIG. 4J, and FIG. 5F is formed will be explained hereunder.

First, an oxidation-preventing insulating layer (not shown) made of alumina, or the like is formed on the second interlayer insulating layer 19 and the first to third conductive plugs 20a to 20c. Then, capacitor contact holes 21 are formed on the upper electrodes 14a, 14b by patterning the oxidation-preventing insulating layer, the second interlayer insulating layer 19, and the capacitor-protection insulating layer 18. At the same time, a cell plate contact hole 21b is formed on the contact area of the cell plate line 12a by patterning the second interlayer insulating layer 19 and the capacitor-protection insulating layer 18.

Then, the oxidation-preventing insulating layer is removed by the etching-back. Then, a wiring metal layer is formed on the second interlayer insulating layer 19 and the first, second, and third conductive plugs 20a, 20b, 20c and in the holes 20a, 20b respectively. Then, the wiring metal layer is patterned by the photolithography method. As the wiring metal layer, a metal layer having a quintuple-layered structure consisting of a TiN layer of 150 nm thickness, a Ti layer of 5 nm thickness, an Al—Cu layer of 500 nm thickness, a TiN layer of 50 nm thickness, and a Ti layer of 20 nm thickness, for example, is formed.

Then, the wiring metal layer is patterned. Thus, a first wiring 22a that connects electrically an inside of the hole 21a on the left-side upper electrode 14a and the first conductive plug 20a on the side of the hole 21a is formed, and also a second wiring 22c that connects electrically the inside of the hole 21a on the right-side upper electrode 14b and the third conductive plug 20c on the side of the hole 21a is formed. At the same time, a second wiring 22d that is connected to the cell plate line 12a via the hole 21b on the contact area of the cell plate line 12a is formed. Simultaneously, a conductive pad 22b is formed on the second conductive plug 20b.

Thus, the upper electrode 14a (14b) of the capacitor $Q_1$ ($Q_2$) over the cell plate line 12a is connected electrically to the n-type impurity diffusion region 7a (7c) via the wiring 22a (22c) and the conductive plug 20a (20c) respectively.

In this case, the second n-type impurity diffusion region 7b is connected electrically to the bit line (not shown), which is formed thereover, via the conductive pad 20b and the second conductive plug 19b.

After the wirings 22a, 22c, 22d and the conductive pad 22b are formed, a third interlayer insulating layer is formed thereon, then a conductive plug is formed, and then a bit line, etc. are formed on the third interlayer insulating layer. But their details will be omitted herein.

In the above embodiment, a plurality of upper electrodes 14a, 14b are formed in two columns along the extending direction of the cell plate line 12a on the ferroelectric layer 13 that covers the cell plate line 12a serving as the lower electrodes of the capacitors $Q_1$, $Q_2$. Therefore, according to the present embodiment, wasteful spaces between the cell plate lines can be reduced in comparison with the structure in which the upper electrodes are aligned in one column on plural cell plate lines respectively. Thus, the capacitors can be integrated more highly than the prior art.

As a result, the present embodiment can contribute to the larger capacity of FeRAM or the reduction of the chip area of FeRAM.

Also, according to the above embodiment, in the steps of forming a plurality of capacitors Q1, Q2 by patterning the first conductive layer 12, the ferroelectric layer 13, and the second conductive layer 14, the upper electrodes 14a, 14b are formed in two columns in one cell plate line forming region, and then the ferroelectric layer 13 is patterned such that the ferroelectric layer 13a that passes under the left-side upper electrodes 14a is formed, and the ferroelectric layer 13b that passes under the right-side upper electrodes 14b is formed, and also the clearance 13s is formed between the left and right dielectric layers 13a, 13b. In addition, the cell plate line 12a having the slit 12s between left and right columns of the capacitors $Q_1$, $Q_2$ is formed by patterning the first conductive layer 12.

Accordingly, in the steps of forming a plurality of capacitors in the cell plate line forming region in two columns, the clearance 16s having the same size as the interval between the left and right upper electrodes 14a, 14b is assured between the second and third resist patterns 16a, 16b used to pattern the ferroelectric layer 13. Therefore, even if the displacement of the resist patterns 16a, 16b is caused within the range of the clearance 16s, areas of the upper electrodes 14a, 14b in the left column and the right column, which are covered with the resist patterns 16a, 16b respectively, become almost identical.

Therefore, even if the displacement to the left side or the right side is caused in the second and third resist patterns 16a, 16b that are to be formed simultaneously, protruded areas of plural upper electrodes 14a, 14b from the resist patterns 16a, 16b become equal as a whole. As a result, even though the upper electrodes 14a, 14b are etched partially according to the etching conditions of the capacitor ferroelectric layer 13, an amount of reduction in respective upper electrodes 14a, 14b in the left column and the right column become equal to each other, and thus areas of the upper surfaces of a plurality of upper electrodes 14a, 14b become equal.

Similarly, in the resist patterns 17 used to pattern the first conductive layer 12, the slit 17s is formed at the position that corresponds to the middle between the upper electrodes 14a in the left column and the upper electrodes 14b in the right column, and both electrodes are united continuously in the contact area without the presence of the slit 17s. Hence, even if displacement of the resist patterns 17 is caused in one of the left and right directions, the areas of the left and right upper electrodes 14a, 14b protruded from the resist patterns 17 become equal because of the presence of the slit 17s. Therefore, etched areas of the upper electrodes 14a, 14b become equal when the first conductive layer 12 is to be etched. As a result, if the areas of the upper electrodes 14a, 14b are reduced according to the etching conditions of the fist conductive layer 12, an amount of reduction in the areas of the upper electrodes 14a, 14b becomes equal in the left column and the right column respectively.

Next, particular examples in case forming positions of the resist patterns 16a, 16b, 17 are displaced from predetermined positions will be given hereunder.

Figure 6A:
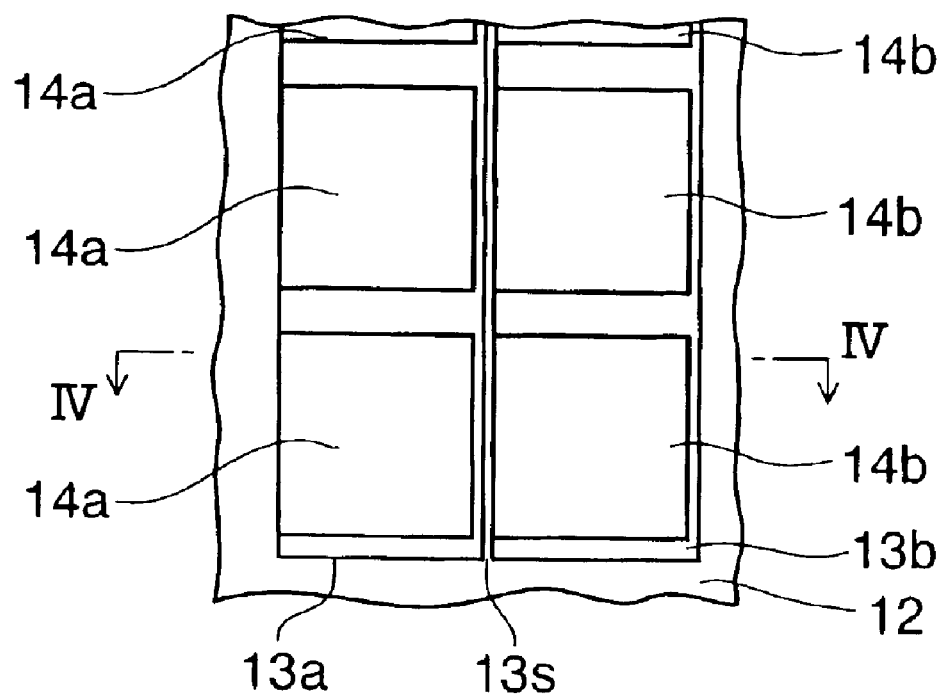
FIG. 6A is a plan view showing a positional relationship between a capacitor upper electrode and a capacitor dielectric layer when positional displacement is caused in a pattern of a ferroelectric layer of the memory cell of the semiconductor device according to the embodiment of the present invention.
Figure 6B:
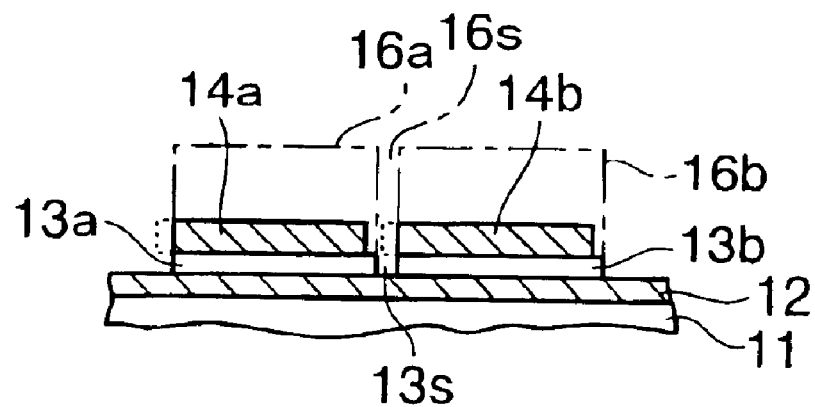
FIG. 6B is a sectional view showing the same.

FIG. 6A is a plan view showing the case where the dielectric layers 13a, 13b are patterned to displace rightward with respect to the upper electrodes 14a, 14b, and FIG. 6B is a sectional view taken along a IV—IV line in FIG. 6A.

In FIGS. 6A and 6B, a broken line indicates etched portions of the upper electrodes 14a, 14b because of the positional displacement of the resist patterns 16a, 16b.

In this case, when the ferroelectric layer 13 is to be patterned, the upper electrodes 14a in the left column are exposed from the left side of the resist pattern 16a and also the upper electrodes 14b in the right column are exposed from the clearance 16s between the resist patterns 16a, 16b. Therefore, if the resist patterns 16a, 16b are displaced to the right direction or the left direction, portions of the upper electrodes 14a, 14b protruded from the resist patterns 16a, 16b are etched away and thus both upper electrodes 14a, 14b are formed to have the substantially same area.

Basically the clearance (slit) 16s between the resist patterns 16a, 16b is set identically to the interval between the left and right upper electrodes 14a, 14b. However, because of the presence of density difference in the pattern density when the resist patterns 16a, 16b are to be formed or etched, in some cases a minute difference of area is caused between the upper electrodes 14a in the left column and the upper electrodes 14b in the right column. For this reason, if a width of the clearance 16s is adjusted by examining previously a relationship between the clearance 16s and the difference of area, such difference of area can be eliminated. This can be similarly applied to the slit 17s between the resist patterns 17 that are used to form the cell plate line 12a.

Figure 7A:
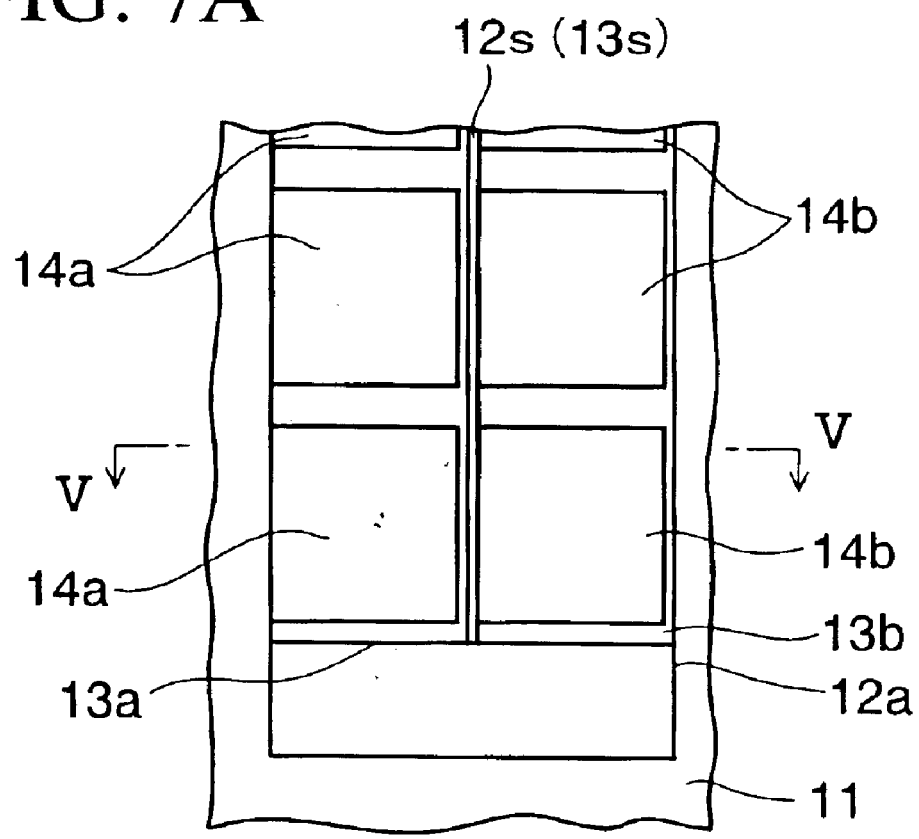
FIG. 7A is a plan view showing a positional relationship when positional displacement is caused in the same direction in the pattern of the capacitor ferroelectric layer and a pattern of a first conductive layer of the memory cell of the semiconductor device according to the embodiment of the present invention.
Figure 7B:
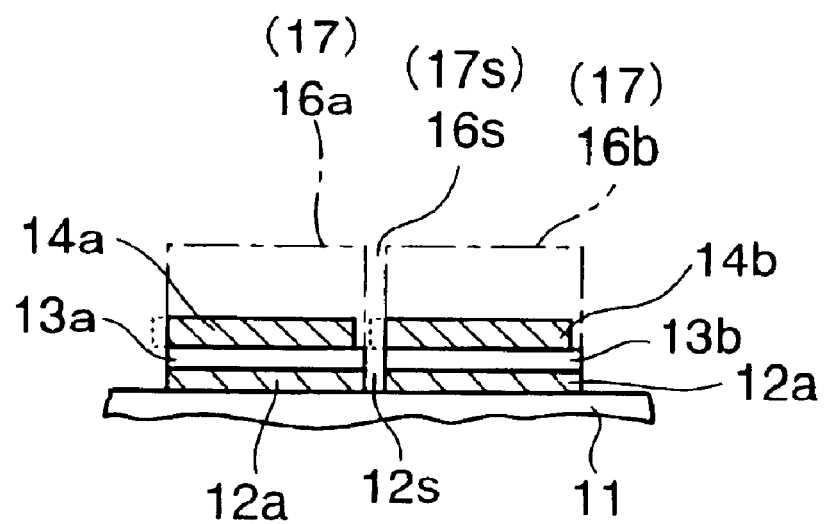
FIG. 7B is a sectional view showing the same.

FIG. 7A is a plan view showing the case where both the dielectric layers 13a, 13b and the lower electrode 12a are patterned to displace rightward with respect to the upper electrodes 14a, 14b, and FIG. 7B is a sectional view taken along a V—V line in FIG. 7A.

In FIGS. 7A and 7B, a broken line indicates etched portions of the upper electrodes 14a, 14b because of the positional displacement of the second and third resist patterns 16a, 16b and the fourth resist pattern 17. In this case, when the ferroelectric layer 13 and the first conductive layer 12 are to be patterned, the portions of the upper electrodes 14a, 14b exposed from the sides of the resist patterns 16a, 16b, 17 and the slits 16s, 17s are etched and thus both upper electrodes 14a, 14b are formed to have the substantially same area.

Figure 8A:
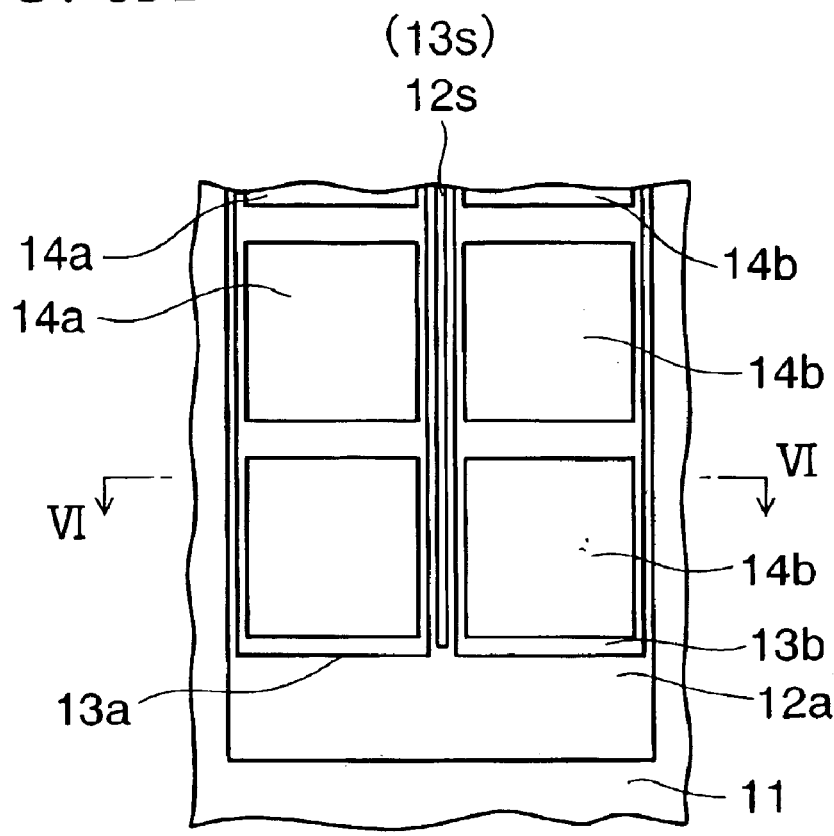
FIG. 8A is a plan view showing a positional relationship when positional displacement is caused in the opposite direction in the pattern of the capacitor ferroelectric layer and the pattern of the first conductive layer of the memory cell of the semiconductor device according to the embodiment of the present invention.
Figure 8B:
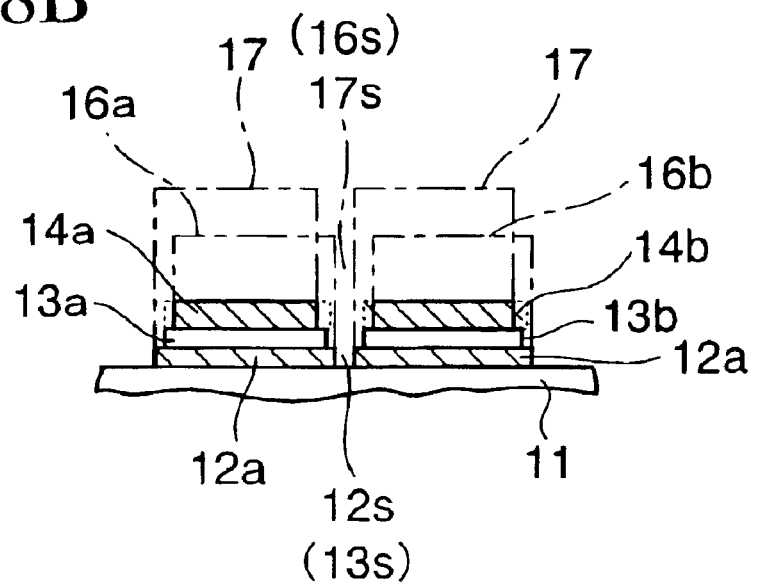
FIG. 8B is a sectional view showing the same.

FIG. 8A is a plan view showing the case where the dielectric layers 13a, 13b are patterned to displace rightward with respect to the upper electrodes 14a, 14b and also the lower electrode 12a is patterned to displace leftward with respect to the upper electrodes 14a, 14b, and FIG. 8B is a sectional view taken along a VI—VI line in FIG. 8A.

In FIGS. 8A and 8B, a broken line indicates etched portions of the upper electrodes 14a, 14b because of the positional displacement of the second and third resist patterns 16a, 16b and the fourth resist pattern 17. In this case, when the ferroelectric layer 13 and the first conductive layer 12 are to be patterned, the portions of the upper electrodes 14a, 14b exposed from the sides of the resist patterns 16a, 16b, 17 and the slits 16s, 17s are etched and thus both upper electrodes 14a, 14b are formed to have the substantially same area.

With the above, the shapes and areas of a plurality of capacitors $Q_1$, $Q_2$ formed in the memory cell region are made equal, and thus the capacitances that do not exert a bad influence upon the device operating margin are obtained.

In this case, in the above embodiment, the case where a plurality of upper electrodes are formed in two columns over one cell plate line is explained. But a plurality of upper electrodes may be formed in three columns or more by two slits over one cell plate line. Also, in the above embodiment, the patternings of the first conductive layer 12, the ferroelectric layer 13, and the second conductive layer 14 are executed by using the resist patterns 15, 16a, 16b, 17 as a mask respectively. But the hard mask made of material such as titanium nitride, silicon oxide, or the like may be employed.

As described above, according to the present invention, the first slits that partition the capacitor upper electrodes in every column are formed on the cell plate line, and the second slits are formed in the ferroelectric layer, which is formed on the cell plate line, at the positions that correspond to the first slits. Therefore, even if the mask used to form the cell plate line or the dielectric layer is displaced leftward or rightward from the desired position, all the capacitor upper electrodes can be exposed from the periphery of the mask and the slits on the opposite side to such displacement to have the same area. As a result, even if the capacitor upper electrodes that are exposed from the mask are etched, the areas of the capacitor upper electrodes can be made uniform.

What is claimed is:

1. A semiconductor device comprising:
   a first insulating layer formed over a semiconductor substrate;
   a cell plate line formed over the first insulating layer and having a slit that divides a region except a contact area of the cell plate line into both sides, the cell plate line connected via the contact area as one body;
   a capacitor dielectric layer formed on the cell plate line on both sides of the slit and having a clearance over the slit; and
   capacitor upper electrodes formed on the capacitor dielectric layer in one column on both sides of the slit.

2. A semiconductor device according to claim 1, wherein the capacitor dielectric layer is divided into two portions by the clearance.

3. A semiconductor device according to claim 1, wherein the capacitor dielectric layer covers a region of an upper surface of the cell plate line except the contact area.

4. A semiconductor device according to claim 1, wherein the slit in the cell plate line is formed in plural at an interval.

5. A semiconductor device according to claim 1, further comprising:
   a second insulating layer formed over the capacitor upper electrodes, the capacitor dielectric layer, the cell plate line, and the first insulating layer;
   a hole formed in the second insulating layer over the contact area of the cell plate line; and
   a wiring formed on the second insulating layer and connected electrically to the contact area via the hole.

6. A semiconductor device according to claim 1, further comprising:
   impurity diffusion regions formed on a surface layer of the semiconductor substrate on both sides of the cell plate line;
   a third insulating layer formed over the cell plate line, the capacitor upper electrodes, the capacitor dielectric layer, and the first insulating layer; and
   wirings formed over the third insulating layer to connect electrically the capacitor upper electrodes and the impurity diffusion regions on a one-by-one basis.

7. A semiconductor device according to claim 6, wherein the impurity diffusion regions constitute a transistor.

8. A semiconductor device according to claim 1, wherein the capacitor dielectric layer is made of ferroelectric substance.

* * * * *